(12) United States Patent
Liao et al.

(10) Patent No.: US 11,287,751 B2
(45) Date of Patent: Mar. 29, 2022

(54) SYSTEM AND METHOD FOR LENS HEATING CONTROL

(71) Applicant: Taiwan Semiconductor Manufacturing Co., Ltd., Hsinchu (TW)

(72) Inventors: Chi-Hung Liao, Hsinchu (TW); Yueh Lin Yang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/942,575

(22) Filed: Jul. 29, 2020

(65) Prior Publication Data

US 2022/0035119 A1  Feb. 3, 2022

(51) Int. Cl.
*G03F 7/20* (2006.01)
*G02B 7/02* (2021.01)

(52) U.S. Cl.
CPC ......... *G03F 7/70891* (2013.01); *G02B 7/028* (2013.01); *G03F 7/7015* (2013.01)

(58) Field of Classification Search
CPC ............................. G03F 7/70891; G02B 7/028
See application file for complete search history.

(56) References Cited

U.S. PATENT DOCUMENTS

| 3,703,858 | A | * | 11/1972 | La Canfora | ............... | G03F 7/20 396/548 |
| 5,390,228 | A | * | 2/1995 | Niibe | ........................ | G03F 7/20 250/492.1 |
| 6,153,877 | A | * | 11/2000 | Ashida | ................ | G03F 7/70875 250/216 |
| 2006/0244940 | A1 | * | 11/2006 | Uehara | ............... | G03F 7/70891 355/69 |
| 2013/0141707 | A1 | * | 6/2013 | Baer | ........................ | G02B 5/00 355/67 |

* cited by examiner

*Primary Examiner* — Steven Whitesell Gordon
(74) *Attorney, Agent, or Firm* — Seed IP Law Group LLP (57) ABSTRACT

Embodiments of the present disclosure provide a system and method for stabilizing optical lens temperatures, including detecting infrared radiation emitted from one or more optical lens, generating an infrared sensor signal based upon the detected infrared radiation, directing emission of light from one or more infrared light sources to the one or more optical lenses, and regulating the emission of the light from the one or more infrared light sources based on the infrared sensor signal for adjusting the temperature of the one or more optical lens.

20 Claims, 7 Drawing Sheets

SYSTEM AND METHOD FOR LENS HEATING CONTROL

BACKGROUND

Optical systems for imaging are used in various industries. Some industries, such as the semiconductor fabrication industry, depend upon optical systems that deliver precise and well-defined dimensions and resolutions that meet submicron imaging standards.

For example, a wafer, formed of a semiconductor substrate, may be illuminated by a light source as part of a conventional semiconductor processing step. For example, a photoresist layer may cover the wafer, which is then exposed to a light pattern that is created by light passing through a reticle of a mask and focused on a plane of the wafer via a lens. Distortion of lens reduces the ability of the process to produce features on the wafer that are precise with well-defined dimensions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "front," "back" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During semiconductor fabrication, the intensity, duration, and wavelength of the exposure light source used in photolithography, as well as the different photolithographic masks that are used for implementation of various semiconductor processing steps, such as etching, deposition, doping, and ion implantation, for example, cause the energy density of light that is incident upon an optical lens system to vary. The variable energy density may cause the focal plane of one or more of the lenses to drift over time, resulting in substandard imaging of the reticle pattern of the mask on the semiconductor substrate or wafer. This may result in defective semiconductor products, such as integrated circuits, that do not perform up to specified standards.

Figure 1:
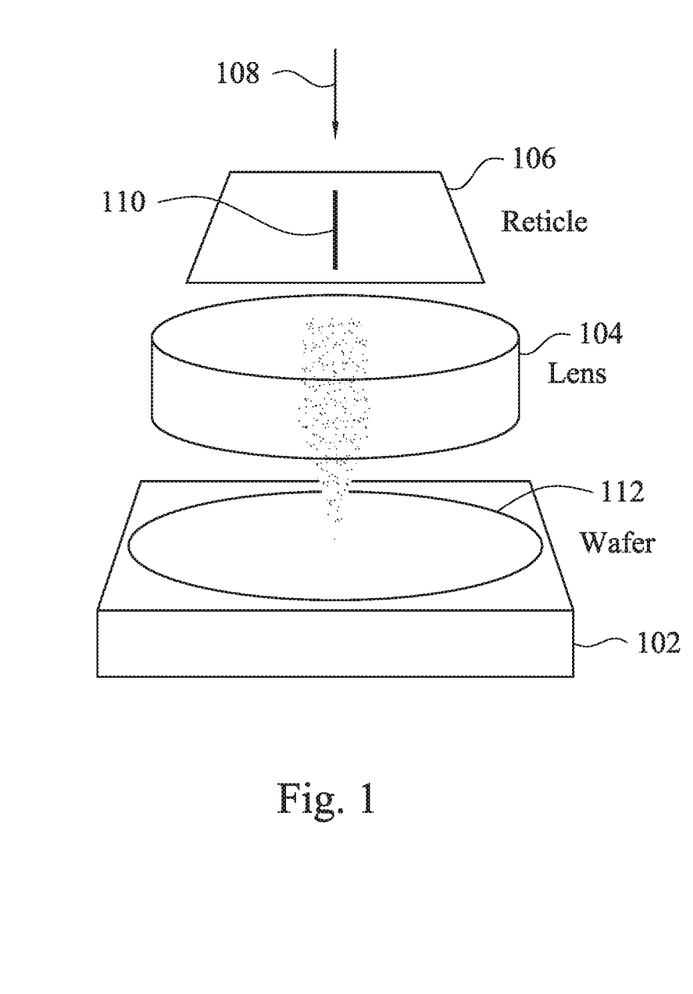
FIG. 1 illustrates a wafer, a lens and a mask.
Figure 2:
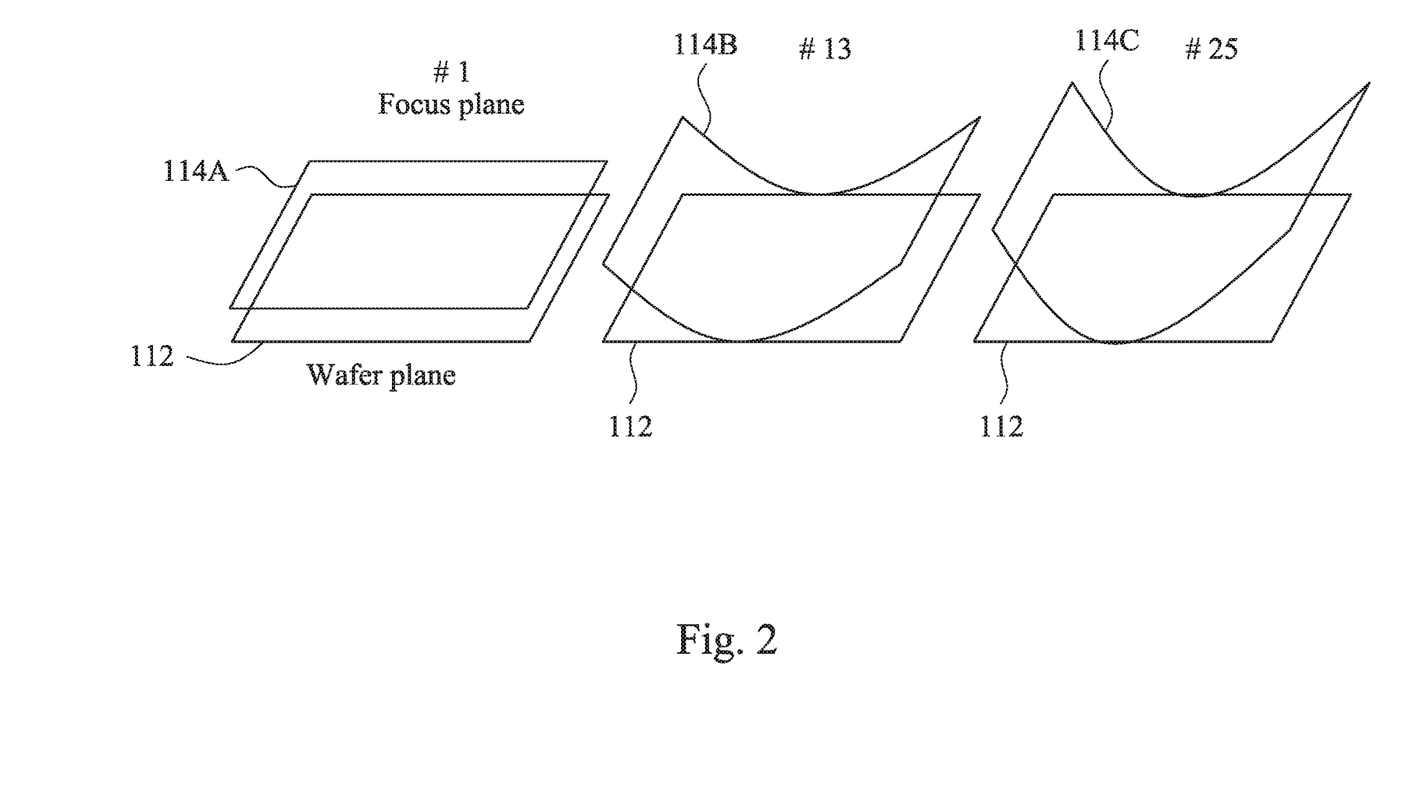
FIG. 2 illustrates a distortion of the focal plane of the lens of FIG. 1.

FIG. 1 illustrates a wafer 102, a lens 104 and a mask 106. The wafer 102 may be, for example, formed of a semiconductor substrate, and may be illuminated by a light source as part of a semiconductor processing step. For example, a photoresist layer may cover the wafer 102, which is then exposed to a light pattern that is created by light 108 passing through a reticle 110 of the mask 106 and focused on a plane 112 of the wafer 102 via the lens 104. However, as the lens 104 heats up from being illuminated, the focal plane 114 (FIG. 2) of the lens 104 may become distorted, as illustrated by FIG. 2. As illustrated by FIG. 2, the focal plane 114A, being originally coincident with the plane 112 of the wafer 102, is distorted into focal planes 114B and 114C as the lens absorbs heat from the incident light and heats up.

Figure 3:
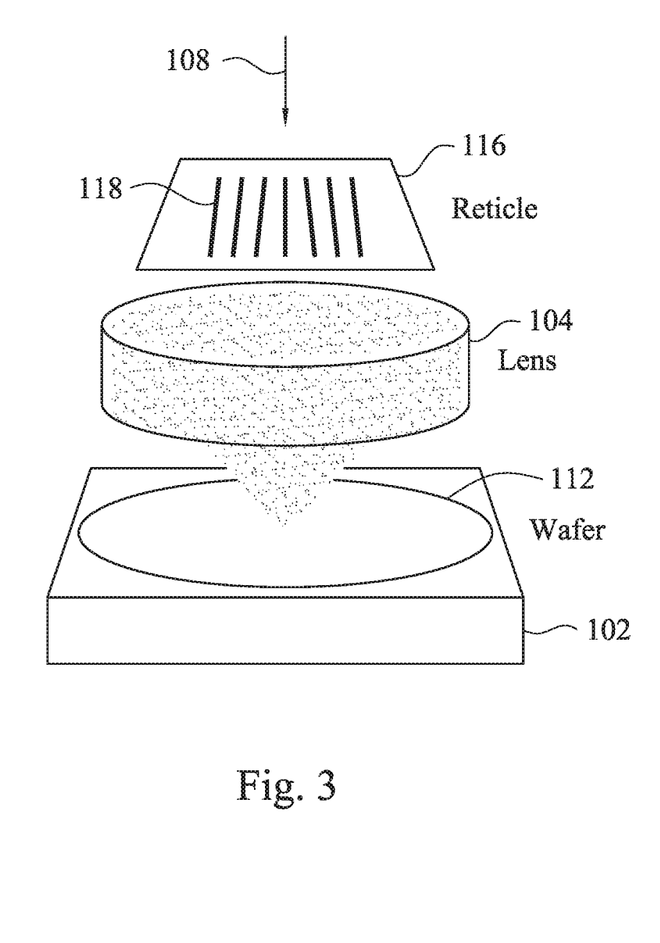
FIG. 3 illustrates a wafer, a lens and a second mask.
Figure 4:
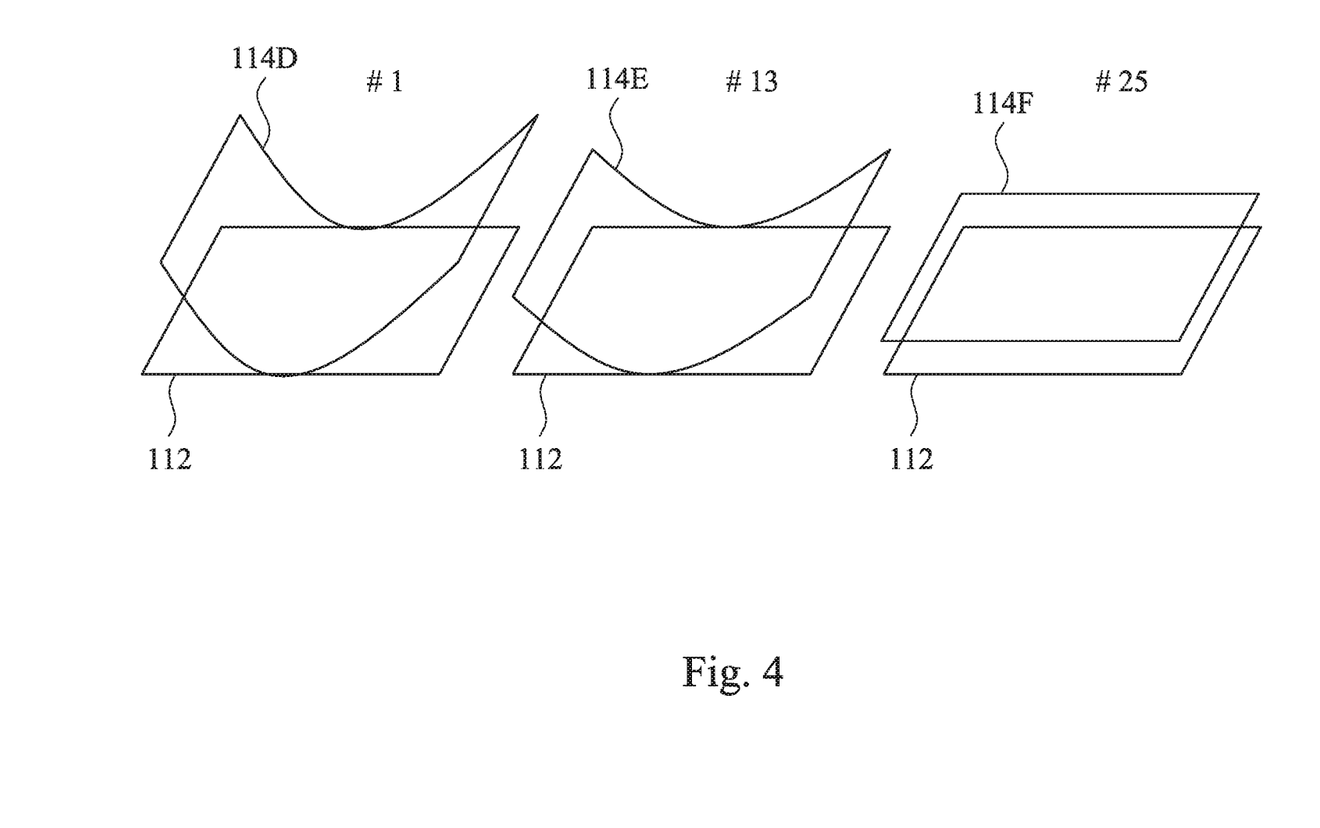
FIG. 4 illustrates a distortion of the focal plane of the lens of FIG. 3.

As FIG. 3 illustrates, when the mask 106 is swapped out for another mask, for example, mask 116 having reticle(s) 118 different in number and/or shape and/or size from reticle 110, then the energy density of the light incident on the lens 104 will be different, for at least the reason that the reticle pattern density is different. The energy density incident on the lens 104 in FIG. 3 is less than the energy density incident on the lens 104 in FIG. 1, and thus as illustrated in FIG. 4, the lens 104 begins to cool, resulting in the focal plane being less distorted from 114D to 114E to 114F.

Focal plane drift, such as that described above with reference to FIGS. 1-4, may cause an upper control limit (UCL) on critical dimension (CD) performance to be exceeded. For example, focal plane drift may cause the CD mean bias to increase, which means that the variance of the widths of lines that are imaged onto a wafer plane via a lens system increases. For example, focal plane drift may cause the CD mean bias to increase to 1.5 nm, resulting in overlapping lines and/or lines that have incorrect impedances and/or inductances, or other undesirable electrical properties. In addition, focal plane drift may cause the UCL on overlay (OVL) performance to be exceeded. For example, focal plane drift may cause an overlay resolution distance to increase by 4 nm between edges of overlain structures, thereby resulting in incorrect capacitances and/or parasitic capacitances.

One technique for controlling lens temperature is to implement water cooling of a lens or lens system. However, a water-cooling system cannot adequately control focal plane drift due to several factors, including, for example, the relatively slow reaction time of water systems to lens temperature changes, and the constraints on the use of water to cool only a small portion of the external surfaces of the lenses. Such constraints result from configuring a water-cooling system that avoids interference with light transmission through the lenses. Water-cooling systems also have the potential to develop leaks and may have high costs due to the supporting infrastructure and space needed for implementation.

Figure 5:
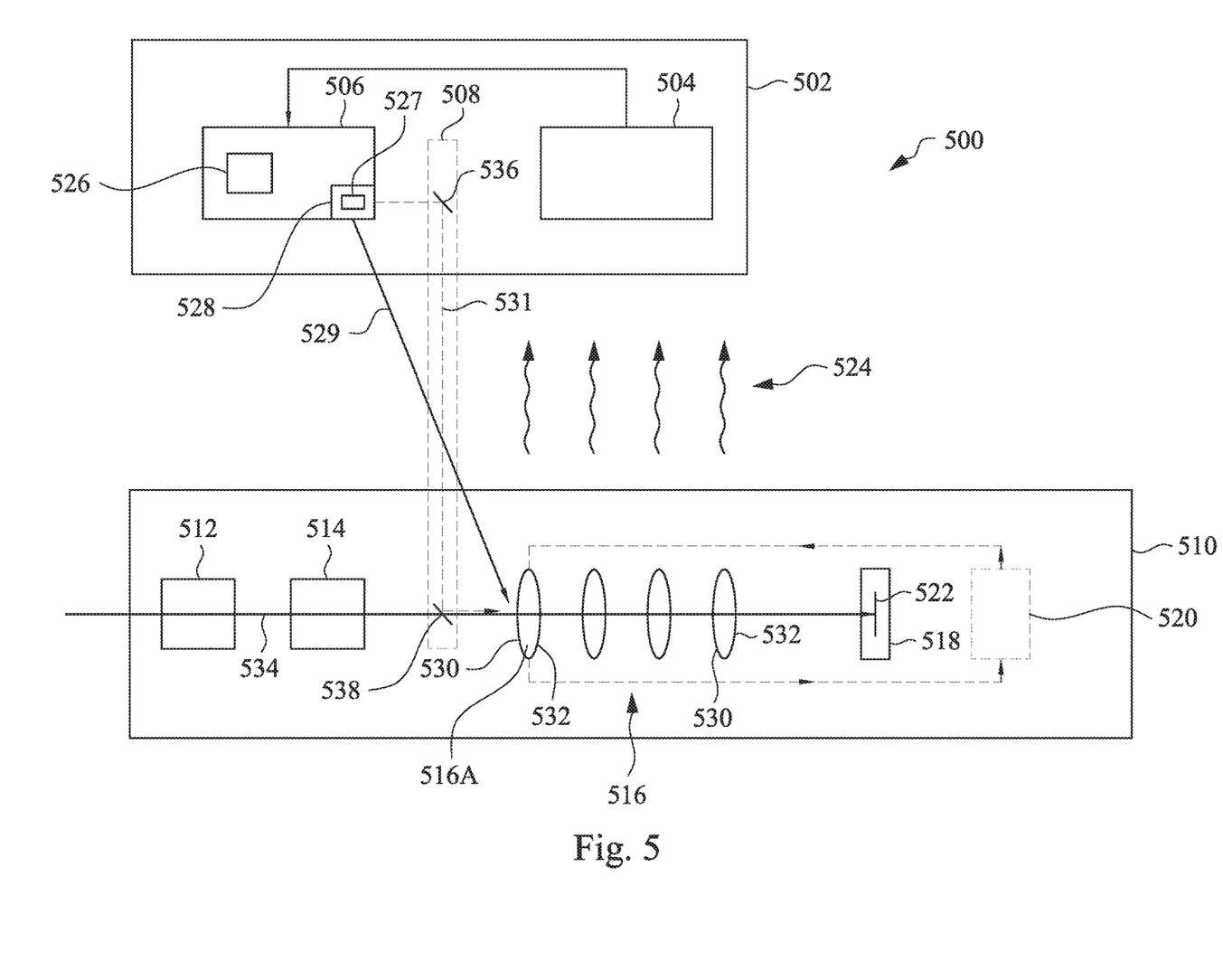
FIG. 5 illustrates a system for stabilizing optical lens temperature, according to an embodiment of the present disclosure.

FIG. 5 illustrates a system 500 for stabilizing optical lens temperature, according to an embodiment of the present disclosure. The system 500 includes a light source control module (LSCM) 502. The LSCM 502 includes an infrared sensor module 504, a light source controller (LSC) 506, and an optional infrared light path controller 508.

In one embodiment, the system 500 may operate in conjunction with an optical lens system, such as optical lens system 510. The optical lens system 510, as illustrated, is used during the fabrication of integrated circuits and/or devices on substrates (e.g., wafer substrates), such as conventional semiconductor substrates, although the scope of the present disclosure covers all types of optical lens systems used in any type of industry that utilize one or more optical lenses. The optical lens system 510 includes an exposure light source 512, a mask 514, one or more optical lenses 516, a wafer 518 or any other substrate, and an optional water-cooling module 520. Conventional optical systems, such as optical systems used for the processing of semiconductor wafers in the fabrication of integrated circuits, are well known in the art and will not be described in detail.

However, to complement the description of the LSCM 502, the operation of the optical lens system 510 in conjunction with an embodiment of an integrated circuit fabrication will be briefly described. The wafer 518 is coated with a light sensitive material (e.g., a photoresist) and light from the exposure light source 512 is passed through the mask 514 having one or more reticles (not shown) (i.e., having a reticle pattern with a reticle pattern density), and the pattern of light created by the mask 514 is focused through one or more optical lenses 516 onto a predefined focal (i.e., image) plane 522 of the photoresist layer of the wafer 518. The exposed photoresist layer may be etched away, thereby exposing a surface of the wafer 518 conforming to the reticle pattern. Further fabrication processing steps may be performed on the wafer 518 (e.g., oxidation, deposition, ion implantation, metallization, etc.), and the steps of coating the wafer 518 with a photoresist, exposing the photoresist to exposure light via a different mask having a different reticle pattern and/or reticle pattern density, and performing additional processing steps may be repeated. The energy density of exposure light incident upon the optical lenses 516 is dependent upon the specific fabrication processing step, which is further dependent upon the energy density of exposure light incident on the mask 514 and the reticle pattern density of the mask 514, as well as the distance between the mask 514 and the optical lenses 516. The energy density of light incident upon the optical lenses 516 may also depend the power of the exposure light source 512 and the spectrum of exposure light from the exposure light source 512.

Based upon the energy density of exposure light incident upon the optical lenses 516, the exposure time of the optical lenses to a given energy density, and/or changes to the energy density of exposure light incident upon the optical lenses 516, the temperature of one or more of the optical lenses 516 may drift in time, thereby causing the image plane 522 to drift in time, or in other words, to become distorted and non-coplanar with the wafer 518.

The optional water-cooling module 520 is configured to cool portions of the optical lenses 516, but as discussed above the effects of such a cooling system cannot be fully realized without interfering with focusing the reticle pattern of the mask 514 on the focal plane 522 of the wafer 518.

Referring now back to the LSCM 502, the infrared (IR) sensor module 504 is positioned to detect IR radiation 524 emitted from the optical lenses 516. In one embodiment, the IR sensor module 504 includes one or more conventional IR detectors positioned with respect to the optical lenses 516 for detecting IR radiation emitted from the optical lenses 516. The intensity and spectrum of the IR radiation is dependent upon the temperature of each optical lens 516, and more specifically, may be dependent upon the temperatures of different portions of each optical lens 516. The IR sensor module 504 is configured to generate IR sensor signals based upon the detected IR radiation. The IR sensor signals represent the temperature of the optical lenses 516 or a portion of the optical lenses 516. In one embodiment, the IR sensor module 504 generates an IR sensor signal that represents an average temperature of the optical lenses 516, however, in another embodiment, the IR sensor module 504 generate IR sensor signals, where each IR sensor signal represents a temperature of a corresponding lens 516. For example, the IR radiation detected by IR detectors of the IR sensor module 504 that are positioned nearest a given lens 516 will be the basis for the IR sensor signal corresponding to that given lens 516. In this manner the IR sensor module 504 will generate IR sensor signals, where each IR sensor signal may represent the temperature of an individual lens 516.

In accordance with the embodiment illustrated in FIG. 5, the LSC 506 includes a processing unit 526 and at least one infrared light source 528. The LSC 506 is configured to receive the infrared sensor signal(s), and the processing unit 526 is configured to direct and/or regulate emission of light from the infrared light source 528 based on the received infrared sensor signal(s). In one embodiment, the infrared light source 528 is configured such that IR light 529 emitted from the IR light source 528 is directed to illuminate (i.e., be incident upon) a front side 530 of a first optical lens 516A of the optical lenses 516. However, in another embodiment, the system 500 includes the optional IR light path controller 508 that is configured for directing the infrared light 531 from the infrared light source 528 to illuminate the front side 530 of the first optical lens 516A of the optical lenses 516. In other embodiments, the infrared light source 528 is configured such that the IR light 529 emitted from IR light source 528 is directed to illuminate (i.e., be incident upon) a back side 532 of a first optical lens 516A of the optical lenses 516. In other embodiments, the system 500 includes the optional IR light path controller 508 that is configured for directing the infrared light 531 from the infrared light source 528 to illuminate the back side 532 of the first optical lens 516A of the optical lenses 516.

In one embodiment, the processing unit 526 is configured to regulate the emission of light from the infrared light source 528 for adjusting or controlling the temperature of the optical lenses 516. For example, in accordance with some embodiments of the present disclosure, the processing unit is configured to regulate the emission of light from the infrared light source such that the temperature of the optical lenses is increased or decreased. In one embodiment, the processing unit 526 regulates the emission of light from the infrared light source 528 to keep the temperature of the optical lenses 516 substantially constant. In other embodiments, regulation of the infrared light emission can be reduced in situations where it is desired to decrease the temperature of optical lenses 516, e.g., when an initial exposure to the infrared light emission has increased the temperature of the lenses 516 above a desired temperature. In yet another embodiment, the processing unit 526 may be communicatively coupled to the exposure light source 512, or a controller (not shown) of the exposure light source 512. The processing unit 526 may then regulate the emission of light from the infrared light source 528 and/or the exposure light source 512 for adjusting or controlling the temperature of the optical lenses 516. For example, in accordance with some embodiments of the present disclosure, the processing unit 526 is configured to regulate the emission of light from the infrared light source and/or the exposure light source 512 such that the temperature of the optical lenses is increased or decreased. In one embodiment, the processing unit 526 regulates the emission of light from the infrared light source 528 and/or the exposure light source 512 to keep the temperature of the optical lenses 516 substantially constant.

For example, as the temperature of one or more of the lenses 516 heat up and cool down, or in other words, drift in time in relation to an ambient temperature, the focal plane 522 of the lenses 516 (also referred to as the focal plane of the lens system) also drifts in time, resulting in the focal plane 522 becoming non-co-planar (i.e., distorted) with respect to a plane of the wafer 518, such as a surface of the wafer 518. This distortion may cause the UCL on critical dimension performance and/or the UCL on overlay performance, which may be limits defined by industry standards, to be exceeded, thereby resulting in batches of wafers having reduced yields with respect to specified performance standards. For example, focal plane drift may result in wafers having circuitry that is faulty or not meeting performance criteria, due to ill-defined metallization, deposition, etching and ion implantation patterns, resulting, for example, in overlapping or broken lines or doped regions that result in short circuits, open circuits, or non-operational components of the circuitry.

In one embodiment, the processing unit 526 regulates the emission of light from the infrared light source 528 based on the received infrared sensor signal that represents a temperature of the lenses 516. In an embodiment, the represented temperature of the lenses 516 may be an average temperature of the lenses 516, a weighted average temperature of the lenses 516, a moving average temperature of the lenses 516, or any other temperature value that can be statistically derived from the individual temperatures of the lenses 516. In one embodiment, the processing unit 526 regulates the emission of light from the infrared light source 528 based on the received infrared sensor signal to keep the temperature of the lenses 516 at a predefined reference temperature. The reference temperature may be chosen such that fluctuations of lens temperatures due to various processing steps are small compared to the reference temperature, and thus focal plane drift is also small (i.e., small or virtually non-existent in comparison with focal plane drift resulting when the optical lens system 510 is employed without the LSCM 502).

In one embodiment, the processing unit 526 regulates the emission of light from the infrared light source 528 for keeping the temperature of each lens 516 at substantially the same reference temperature, however, in another embodiment, the processing unit 526 regulates the emission of light from the infrared light source 528 for keeping the temperature of each lens 516 at different constant temperatures. In an embodiment, the processing unit 526 regulates the emission of light from the infrared light source 528 by regulating one or more of: a power of the light source 528; the spectrum of light emitted from the light source 528, including intensity, wavelengths, and phases of the components of the emitted infrared light; the selection of which of the one or more infrared light sources 528 to turn on; and the selection of the duration of on-times for the one or more infrared light sources 528.

In some embodiments, the light source 528 includes one or more infrared light sources, e.g., one or more infrared light emitting diodes (LEDs), and electronic power management circuitry 527 for driving the one or more infrared light sources (e.g., the one or more LEDs) by outputting electrical signals at various voltage, frequency and pulse width levels to increase or decrease intensity of components of the emitted infrared light. The components may refer to various light frequency ranges in the infrared spectrum. Increasing voltage, frequency and/or pulse width of each electrical signal may increase intensity of the light outputted by the LEDs. Decreasing the voltage, frequency and/or pulse width of each electric signal may decrease the intensity of the light outputted by the LEDs. Increasing or decreasing the number of LEDs of the one or more LEDs being driven may also increase or decrease overall intensity of the light source 528, respectively.

In some embodiments, the electronic power management circuitry 527 is configured to receive control signals from the processing unit 526. The processing unit 526 generates the control signals based on the infrared sensor signals received from the infrared sensor module 504. In one embodiment, the electronic power management circuitry 527 drives the one or more infrared light sources by generating electrical signals at various voltage, frequency and pulse width levels based upon the received control signals.

In some embodiments, when the temperature is above a predetermined value, the electronic power management circuitry reduces voltage, frequency and/or pulse width of at least one of the electrical signals driving the LEDs by a predetermined amount, which may be based upon a predefined percentage or a predefined absolute value. In some embodiments, when the temperature is below the predetermined value, the electronic power management circuitry increases voltage, frequency and/or pulse width of at least one of the electrical signals driving the LEDs by a predetermined amount, which may be a percentage or an absolute value. In some embodiments, the electronic power management circuitry turns off (does not drive) certain of the LEDs for a predetermined period of time while leaving certain other of the LEDs turned on (driven) to reduce the intensity and thereby lower the temperature.

In one embodiment, the optical lens system 510 includes only a single lens, e.g., lens 516A. However, in another embodiment, the optical lens system has n lenses, where n is an integer greater than 1. For example, the optical lens system of FIG. 5 has n=4 optical lenses. As illustrated, each lens has a front side 530 and a back side 532 opposite the front side, and the lenses 516 are arranged back side to front side (also referred to as back-to-front) along a longitudinal axis 534. In one embodiment, the longitudinal axis 534 is the optical axis of each of the lenses 516.

In one embodiment, the LSCM 502 includes the optional infrared light path controller 508. The light path controller 508 includes one or more light path direction devices for changing the direction of propagation of the infrared light emitted from the infrared light source 528. In one embodiment, infrared light path controller 508 includes a first light path direction device 536 for reflecting or refracting or diffracting the IR light received from the infrared light source 528, and a second light path direction device 538 for reflecting or refracting or diffracting the IR light received from the first light path direction device 536. In an embodiment, the second light path direction device 538 is configured to direct the IR light to illuminate the front side 530 of the first optical lens 516A, and pass the light from the exposure light source 512 to illuminate the front side 530 of the first optical lens 516A. In other embodiments, the light path controller includes light path direction devices that cooperate to direct the IR light to illuminate the back side 532 of the first optical lens 516A or other of the optical lenses 516. Although FIG. 5 illustrates the infrared light path controller 508 having two light path direction devices, the present disclosure covers the infrared light path controller 508 having any number of light path direction devices for routing the infrared light from the infrared light source 528 to the front side 530 of the first optical lens 516A.

In one embodiment, the light path direction devices 536, 538 may be light reflectors (including two-way mirrors), light refractors, such as a prism, light diffractors or optical lenses having, for example, high refractive indices.

Figure 6:
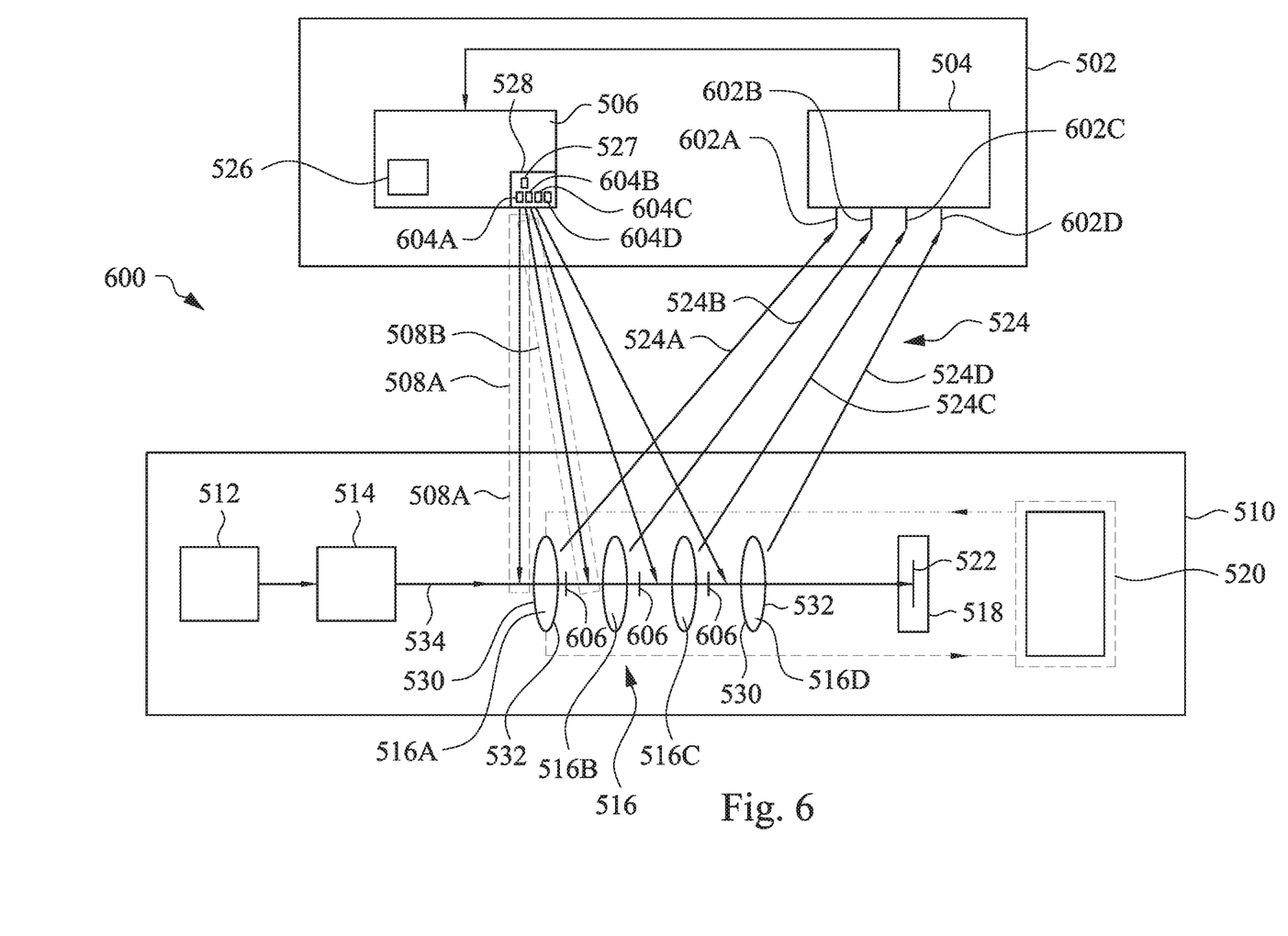
FIG. 6 illustrates a system for stabilizing optical lens temperature, according to an embodiment of the present disclosure.

FIG. 6 illustrates a system 600 for stabilizing optical lens temperature, according to an embodiment of the present disclosure. Elements that are the same as elements of FIG. 5 have the same reference numbers as FIG. 5 and will not be discussed in further detail.

As illustrated by FIG. 6, the infrared sensor module 504 includes n infrared sensor detectors 602, where n is any integer greater than 1. In this exemplary embodiment n=4, however the scope the present disclosure covers any integer n. Each infrared sensor detector 602 is configured to detect infrared radiation 524 (i.e., detect an infrared radiation signal) emitted from a corresponding optical lens of the optical lenses 516. For example, infrared sensor detector 602A is configured to detect an infrared radiation signal 524A (also referred to as infrared radiation 524A) emitted from the corresponding optical lens 516A, infrared sensor detector 602B is configured to detect an infrared radiation signal 524B emitted from the corresponding optical lens 516B, infrared sensor detector 602C is configured to detect an infrared radiation signal 524C emitted from the corresponding optical lens 516C, and infrared sensor detector 602D is configured to detect an infrared radiation signal 524D emitted from the corresponding optical lens 516D. Although a body emits infrared radiation in an isotropic pattern when the temperature of the body is uniform throughout, the infrared radiation signals emitted from the lenses 516 are drawn as rays as a matter of convenience of illustration.

In one embodiment, the infrared sensor module 504 is configured to generate n infrared sensor signals. For example, the infrared sensor module 504 generates an infrared sensor signal based on each infrared radiation signal 524 detected by each infrared sensor detector 602, such that each infrared sensor signal represents a temperature of a corresponding optical lens 516. In the FIG. 6 embodiment, the infrared sensor module 504 generates n=4 infrared sensor signals, where each infrared sensor signal represents a temperature of one of the four optical lenses 516.

In one embodiment, each infrared sensor detector 602 is oriented and/or configured with respect to its corresponding optical lens for detecting the infrared radiation emitted by its corresponding optical lens. Although any given infrared sensor detector, e.g., detector 602B, may also detect infrared radiation emitted from other optical lenses, such as lenses 516A, 516C and 516D, any given detector is configured such that a majority of the detected infrared radiation is received from its corresponding optical lens (e.g., lens 516B). In one embodiment, the infrared sensor detectors 602 are positioned in proximity to their corresponding optical lenses 516. In another embodiment, the infrared sensor detectors 602 are antennas, and the infrared sensor module 504 includes control circuitry for controlling the phases of the antennas such that each antenna receives infrared signals from a specified direction, such as a direction defined from a lens to a corresponding antenna.

In one embodiment, the processing unit 526 is configured to regulate the emission of light from the infrared light source 528 for keeping the temperature of each optical lens of the n optical lenses 516 substantially constant. In another embodiment, the processing unit 526 is configured to regulate the emission of light from the infrared light source 528 for keeping the temperature of each optical lens of the n optical lenses 516 substantially constant and substantially the same, and yet in another embodiment, substantially constant but at different temperatures. In yet other embodiments, the processing unit 526 is configured to regulate the emission of light from the infrared light source 528 and thereby adjust or control the temperature of each optical lens of then optical lenses 516.

In yet another embodiment, the processing unit 526 may be communicatively coupled to the exposure light source 512, or a controller (not shown) of the exposure light source 512. The processing unit 526 may then regulate the emission of light from the infrared light source 528 and/or the exposure light source 512 for keeping the temperature of each optical lens of the n optical lenses 516 substantially constant. In another embodiment, the processing unit 526 is configured to regulate the emission of light from the infrared light source 528 and/or the exposure light source 512 for keeping the temperature of each optical lens of the n optical lenses 516 substantially constant and substantially the same, and yet in another embodiment, substantially constant but at different temperatures. In yet other embodiments, the processing unit 526 is configured to regulate the emission of light from the infrared light source 528 and/or the exposure light source 512 and thereby adjust or control the temperature of each optical lens of the n optical lenses 516.

In one embodiment, the infrared light source 528 includes n infrared light sources 604, and the processing unit 526 is configured to regulate the emission of light from each of the n infrared light sources 604 for adjusting or controlling the temperature of each optical lens, keeping the temperature of each optical lens of the n optical lenses 516 substantially constant and either substantially the same or at substantially different constant temperatures.

In an embodiment, the system 600 includes one or more optional light path controllers 508. Although not specifically illustrated, each light path controller, e.g., light path controllers 508A and 508B, may include one or more light path direction devices, such as light path direction devices 536, 538 as illustrated by FIG. 5. Each light path controller 508 is configured to receive light from the infrared light source 528, or alternatively from one of the n infrared light sources 604, and direct the light from infrared light source (or one of the n infrared light sources 604) to the front side 530 of an associated optical lens of the n optical lenses 516. For example, light path controller 508A is configured to receive light from the infrared light source 604A and direct the light to the front side 530 of the optical lens 516A. In another embodiment, the infrared light source 528 (or one or more of the infrared light sources 604) is configured and/or positioned to direct light to a front side 530 of one or more of the optical lenses 516, without using a light path controller 508. For example, infrared light source 528 (or alternatively infrared light source 604C) is configured to direct light to a front side 530 of the optical lenses 516C. The scope of the present disclosure covers a system 600 including zero or more light path controllers 508 for directing the infrared light from the infrared light source 528 to the front side 530 of the optical lenses 516.

In another embodiment of the invention, the system 600 includes n−1 infrared filters 606. Each infrared filter 606 is positioned along the longitudinal axis 534 between a corresponding pair of the n optical lenses 516 for preventing transmission of infrared radiation between the n optical lenses 516 along the longitudinal axis 534. Each infrared filter is also configured to pass light from the exposure light source 512 along the direction of the longitudinal axis 534. In one embodiment, the processing unit 526 regulates the emission of infrared light that is to be incident on each lens 516 based on the received infrared sensor signal(s) that indicate the temperature of each lens 516, and further based on the infrared isolation of each optical lens 516 from the other optical lenses 516. In other words, the infrared filters 606 prevent any given optical lens from receiving any infrared radiation from other optical lenses, and thus a temperature of any given optical lens may be regulated based only on the infrared radiation received from the infrared light source 528.

In yet another embodiment, the processing unit 526 is configured to regulate emission of the light from the infrared light source 528 by regulating a spectrum of the light emitted from the infrared light source 528, regulating an intensity of the light emitted from the infrared light source 528, and/or regulating a length of time the infrared light source 528 is turned on.

In one embodiment, the systems 500, 600 include the mask 514 positioned along the longitudinal axis 534 between the exposure light source 512 and the first optical lens 516A. The mask 514 may have one or more reticles arranged in a pattern for forming a pattern on the focal plane 522 of the wafer 518 or any other substrate. The energy density of the exposure light incident on the optical lenses 516 is based, at least in part, on a reticle pattern density.

In another embodiment, the infrared light source 528 is configured to emit light having a wavelength of approximately 0.76-1000 micron, although the scope of the present disclosure covers wavelengths outside this range.

Figure 7:
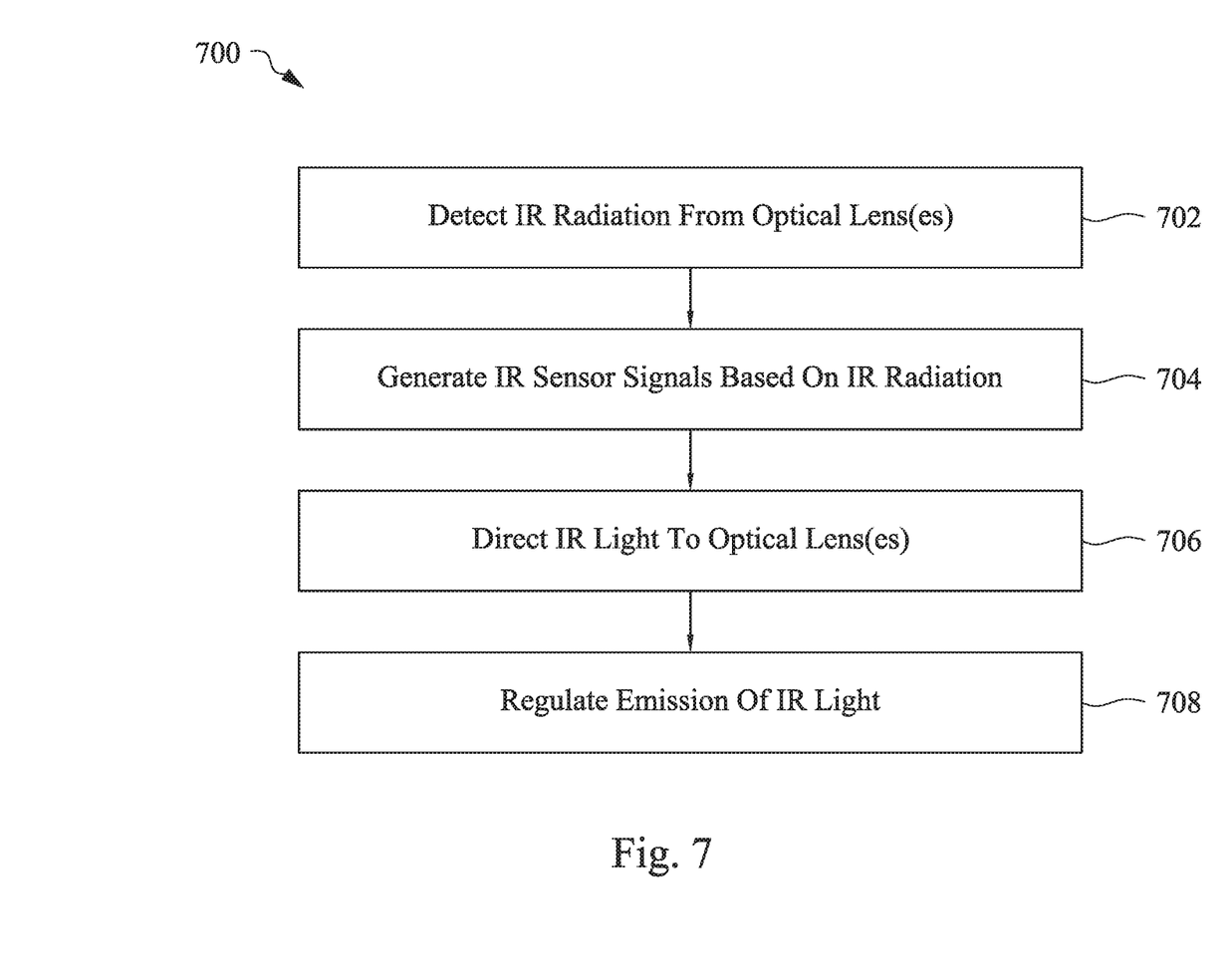
FIG. 7 illustrates a flowchart of a method for adjusting and/or stabilizing optical lens temperature, according to an embodiment of the present disclosure.

FIG. 7 is a flowchart illustrating a method 700 for adjusting and/or stabilizing lens temperature, according to an embodiment of the present disclosure.

In step 702, the infrared sensor module 504 detects infrared radiation 524 emitted from one or more one optical lens 516. In one embodiment, the optical lenses 516 receive light emitted from an exposure light source 512. The received light may have a variable energy density. If the lenses 516 are not in a thermal steady state, or if the energy density of the exposure light incident on the lenses 516 is changing, then the lenses 516 may be heating up or cooling down, thereby leading to an unstable focal plane (i.e., a focal plane that is in a transient state).

In step 704, the infrared sensor module 504 generates one or more infrared sensor signals based upon the detected infrared radiation. In one embodiment, the infrared sensor signal represents an average temperature of the one or more optical lenses 516, however, in other embodiments, the infrared sensor signal represents a weighted average of the temperatures of the one or more lenses 516 or the infrared sensor signal includes a plurality of infrared sensor signals, where each infrared sensor signal represents a temperature of an associated lens of the plurality of lenses 516.

In step 706, the processing unit 526 directs emission of light from one or more infrared light sources 528 to one or more optical lenses 516.

In step 708, the processing unit 526 regulates the emission of light from the one or more infrared light sources 528 and/or the exposure light source 512, based on the infrared sensor signal(s), for adjusting and/or controlling the temperature of the one or more optical lens 516, e.g., raising the temperature of the one or more optical lens 516, lowering the temperature of the one or more optical lens 516 or keeping the temperature of the one or more optical lens 516 substantially constant. Thus, even though the lenses 516 may be receiving exposure light of variable energy density due, for example, to different masks having different reticle pattern densities and/or exposure light sources operating under different power and/or spectrum conditions, the method 700 of the present disclosure uses infrared radiation feedback from the lenses via infrared sensor signals to direct/regulate the emission of infrared light from an infrared light source and/or regulate emission from the exposure light source 512 to adjust and/or stabilize the temperature of each of the lenses, thereby mitigating focal plane drift of the optical lenses.

The present disclosure provides a system for stabilizing optical lens temperature. In embodiments, the system includes a light source control module having an infrared sensor module positioned to detect infrared radiation emitted by one or more optical lenses and generate infrared sensor signal(s) based on the detected infrared radiation. The infrared sensor signal(s) represent the temperature of one or more of the optical lenses. In one embodiment, the one or more optical lenses receive light (such as light used in photolithographic processes) from a first (e.g., exposure) light source. The energy density of the light received at the one or more optical lens from the first light source may be variable. The light source control module may also include a light source controller. The light source controller may have a processing unit and one or more infrared light sources. In one embodiment, the processing unit is configured to receive the infrared sensor signal(s) and direct and/or regulate emission of light from the one or more infrared light sources based on the received infrared sensor signal(s). In an embodiment, the light source control module is positioned such that the one or more one optical lenses receives the light from the one or more infrared light sources. In one embodiment, the processing unit is configured to regulate the emission of light from the one or more infrared light sources for keeping the temperature of the one or more optical lenses substantially constant.

The present disclosure provides a method for stabilizing lens temperature. In embodiments, the method includes detecting infrared radiation emitted from one or more optical lens, where the one or more optical lenses receive light emitted from a first (e.g., exposure) light source. The light received from the exposure light source may have a variable energy density. The method further includes generating an infrared sensor signal based upon the detected infrared radiation, directing emission of light from one or more infrared light sources to one or more optical lenses, and regulating the emission of the light from the one or more infrared light sources based on the infrared sensor signal for keeping the temperature of the one or more optical lens substantially constant. In one embodiment, the infrared sensor signal represents the temperature of the one or more optical lenses.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A system for stabilizing optical lens temperature, comprising:
   n optical lenses, wherein n is an integer greater than 1, wherein each optical lens of the n optical lenses has a front side and a back side opposite the front side, wherein the n optical lenses are arranged back side to front side along a longitudinal axis;
   n−1 infrared filters, each infrared filter positioned along the longitudinal axis between a corresponding pair of the n optical lenses for preventing transmission of infrared radiation between the n optical lenses along the longitudinal axis; and
   a light source control module, including:
   an infrared sensor module positioned to detect infrared radiation emitted by at least one of the n optical lens and generate an infrared sensor signal representing the temperature of the at least one of the n optical lens, the at least one of the n optical lens receiving light from a first light source, an energy density of the light received at the at least one of the n optical lens from the first light source having a variable energy density; and
   a light source controller including a processing unit and at least one infrared light source, the at least one infrared light source including electronic power management circuitry, the processing unit configured to receive the infrared sensor signal and generate a control signal, the electronic power management circuitry configured to receive the control signal and regulate emission of light from the at least one infrared light source, the infrared light source configured to direct the light to the at least one of the n optical lens.

2. The system of claim 1, further comprising a water-cooling module coupled to the at least one of the n optical lens, the water-cooling module adapted to circulate water around at least a portion of the at least one of the n optical lens.

3. The system of claim 1, further comprising a light path controller for directing the light from the infrared light source to the front side or backside of a first optical lens of the n optical lenses.

4. The system of claim 3, wherein the light path controller includes one or more light path direction devices, the one or more light path direction devices selected from the group of: light reflectors, light refractors, light diffractors and second optical lenses.

5. The system of claim 4, wherein a first light path direction device of the one or more light path direction devices is positioned along the longitudinal axis between the first optical lens and the first light source for passing the light emitted by the first light source to the front side of the first optical lens, wherein the other optical lenses of the n optical lenses are positioned along the longitudinal axis to receive the light passed through the first optical lens from the first light source and wherein the first light path direction device is configured to direct the light emitted from the infrared light source to the front side of the first optical lens.

6. The system of claim 5, wherein the infrared sensor module is configured to detect the infrared radiation emitted by all optical lenses of the n optical lenses as a single infrared radiation signal and generate the infrared sensor signal representing an average temperature of all optical lenses of the n optical lenses.

7. The system of claim 1, wherein the processing unit is configured to regulate emission of the light from the at least one infrared light source by at least one of: regulating a spectrum of the light emitted from the infrared light source regulating an intensity of the light emitted from the infrared light source, and regulating a length of time the infrared light source is turned on.

8. The system of claim 1, wherein the system further comprises a mask positioned along the longitudinal axis between the first light source and the first optical lens, the mask having one or more reticles arranged in a pattern, wherein the variable energy density is based upon a reticle pattern density and a power of the first light source.

9. The system of claim 1, wherein a wavelength of the light from the at least one infrared light source is approximately 0.76-1000 micron.

10. The system of claim 1, wherein the electronic power management circuitry is configured to regulate the emission of light from the at least one infrared light source for keeping the temperature of the at least one optical lens substantially constant.

11. A system for stabilizing optical lens temperature, comprising:
    at least one optical lens; and
    a light source control module, including:
    an infrared sensor module positioned to detect infrared radiation emitted by the at least one optical lens and generate an infrared sensor signal representing the temperature of the at least one optical lens, the at least one optical lens receiving light from a first light source, an energy density of the light received at the at least one optical lens from the first light source having a variable energy density, and
    a light source controller including a processing unit and at least one infrared light source, the at least one infrared light source including electronic power management circuitry, the processing unit configured to receive the infrared sensor signal and generate a control signal, the electronic power management circuitry configured to receive the control signal and regulate emission of light from the at least one infrared light source, wherein
    the at least one optical lens comprises n optical lenses, wherein n is an integer greater than 1, wherein each optical lens of the n optical lenses has a front side and a back side opposite the front side, wherein the n optical lenses are arranged back side to front side along a longitudinal axis, wherein
    the system further comprises n light path controllers, each light path controller associated with an optical lens of the n optical lenses, each light path controller configured to direct the light from the infrared light source to the front side or the backside of the associated optical lens of the n optical lenses, and wherein
    the system hither comprises n−1 infrared filters, each infrared filter positioned along the longitudinal axis between a corresponding pair of the n optical lenses for preventing transmission of infrared radiation between the n optical lenses along the longitudinal axis.

12. The system of claim 11, wherein each light path controller includes one or more light path direction devices, wherein a first light path direction device of the one or more light path direction devices for each light path controller is positioned along the longitudinal axis adjacent to the front side of the associated optical lens for passing the light emitted by the light source to the front side of the associated optical lens and directing the light emitted from the infrared light source to the front side of the associated optical lens.

13. The system of claim 12, wherein the infrared sensor module is configured to detect the infrared radiation emitted by the n optical lenses as n infrared radiation signals, each infrared radiation signal associated with a corresponding optical lens of the n optical lenses, and wherein the infrared sensor module is further configured to generate n infrared sensor signals based on the n infrared radiation signals, each infrared sensor signal representing a temperature of the corresponding optical lens.

14. The system of claim 13, wherein the infrared sensor module comprises n infrared sensor detectors, each infrared sensor detector oriented with respect to the corresponding optical lens for detecting the infrared radiation emitted by the corresponding optical lens.

15. The system of claim 11, wherein the at least one infrared light source comprises n infrared light sources, and wherein each of the n light path controllers is configured to receive light from a corresponding infrared light source and direct the light from the corresponding infrared light source to the front side of the associated optical lens of the n optical lenses.

16. The system of claim 11, further comprising a water-cooling module coupled to the at least one of the n optical lens, the water-cooling module adapted to circulate water around at least a portion of the at least one of the n optical lens.

17. A method for stabilizing lens temperature, comprising:
isolating, using an infrared filter between a first optical lens and a second optical lens, the first optical lens from infrared radiation emitted by the second optical dens, the first optical lens and the second optical lens being two lenses of n optical lenses wherein n is an integer greater than 1;
detecting infrared radiation emitted from the first optical lens, wherein the first optical lens receives light emitted from a first light source, the light received from the first light source having a variable energy density;
generating an infrared sensor signal based upon the detected infrared radiation, the infrared sensor signal representing the temperature of the first optical lens;
generating a control signal based on the infrared sensor signal;
regulating emission of light from at least one infrared light source based on the control signal; and
directing emission of the light from the at least one infrared light source to the first or the second optical lens.

18. The method of claim 17, wherein the regulating the emission of the light from the at least one infrared light source based on the control signal comprises regulating the emission of the light from the at least one infrared light source based on the control signal to keep the temperature of the first or the second optical lens substantially constant.

19. The method of claim 17, further comprising:
circulating water around at least a portion of the first optical lens or the second optical lens.

20. The method of claim 17, wherein regulating the emission of the light from the at least one infrared light source based on the control signal comprises regulating the emission of the light from the at least one infrared light source by at least one of: regulating a spectrum of the light emitted from the infrared light source, regulating an intensity of the light emitted from the infrared light source, and regulating a length of time the infrared light source is turned on.

* * * * *

UNITED STATES PATENT AND TRADEMARK OFFICE
CERTIFICATE OF CORRECTION

PATENT NO. : 11,287,751 B2
APPLICATION NO. : 16/942575
DATED : March 29, 2022
INVENTOR(S) : Chi-Hung Liao et al.

Page 1 of 1

It is certified that error appears in the above-identified patent and that said Letters Patent is hereby corrected as shown below:

In the Claims

Column 12, Claim 11, Line 65:
"the system hither comprises" should read: --the system further comprises--.

Column 14, Claim 17, Line 4:
"optical dens," should read: --optical lens,--.

Signed and Sealed this
Seventh Day of November, 2023

Katherine Kelly Vidal
*Director of the United States Patent and Trademark Office*